United States Patent
Jang

Patent Number: 5,986,938
Date of Patent: Nov. 16, 1999

[54] WORDLINE DRIVER FOR SEMICONDUCTOR MEMORY DEVICE

[75] Inventor: Seong-Jin Jang, Seoul, Rep. of Korea

[73] Assignee: LG Semicon Co., Ltd., Choongcheongbuk-Do, Rep. of Korea

[21] Appl. No.: 09/168,983

[22] Filed: Oct. 9, 1998

[30] Foreign Application Priority Data

Apr. 16, 1998 [KR] Rep. of Korea .................. 98/13619

[51] Int. Cl.[6] .................................................. G11C 16/06
[52] U.S. Cl. ............................ 365/185.23; 365/230.03; 365/230.06
[58] Field of Search ........................... 365/208, 230.03, 365/185.23, 230.08, 230.06

[56] References Cited

U.S. PATENT DOCUMENTS

| | | | |
|---|---|---|---|
| 5,293,342 | 3/1994 | Casper et al. | 365/203 |
| 5,696,727 | 12/1997 | Tsukude et al. | 365/208 |
| 5,831,924 | 11/1998 | Nitta et al. | 365/230.03 |

OTHER PUBLICATIONS

Noda, K. et al., "A Boosted Dual Word–line Decoding Scheme for 256Mb DRAMs", *1992 Symposium on VLSI Circuits Digest of Technical Papers*, pp. 112–113, 1992.

*Primary Examiner*—Trong Phan
*Assistant Examiner*—Thong Le
*Attorney, Agent, or Firm*—Morgan, Lewis & Bockius LLP

[57] ABSTRACT

A wordline driver for a memory device includes a row decoder decoding externally inputted row address signals and outputting a main decoding signal and a main decoding bar signal, a wordline drive decoder decoding two lowest bits among the row address signals and outputting a global decoding signal, a local wordline driver receiving first and second signals and outputting a local wordline driving signal in accordance with the global decoding signal corresponding to the wordline drive decoder, and a sub-wordline driver coupled to the wordline drive decoder and the local wordline driver and outputting a sub-wordline driving signal to a sub-wordline in accordance with the local wordline decoding signal from the local wordline driver, and the main decoding signal and the main decoding bar signal outputted from the row decoder.

10 Claims, 5 Drawing Sheets

BACKGROUND ART  MWL

BACKGROUND ART  MWLb

BACKGROUND ART  WDi

BACKGROUND ART  SWL

FIG. 7
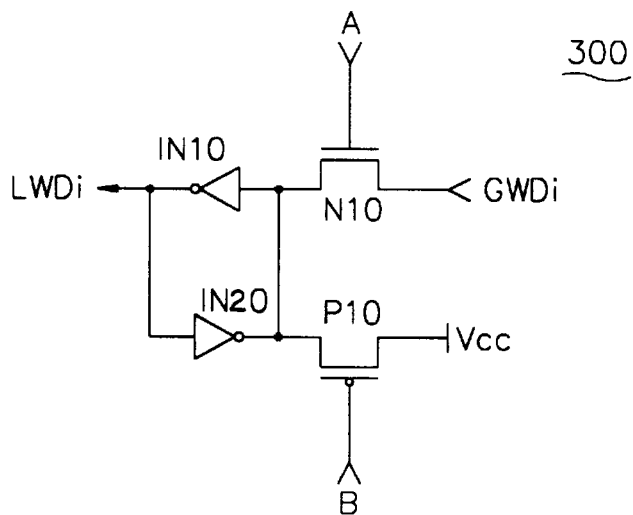
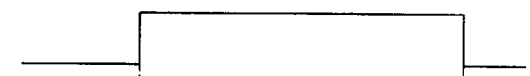
FIG. 8A  MWL
FIG. 8B  GWDi
FIG. 8C  A
FIG. 8D  B
FIG. 8E  LWDi
FIG. 8F  SWL FIG. 9
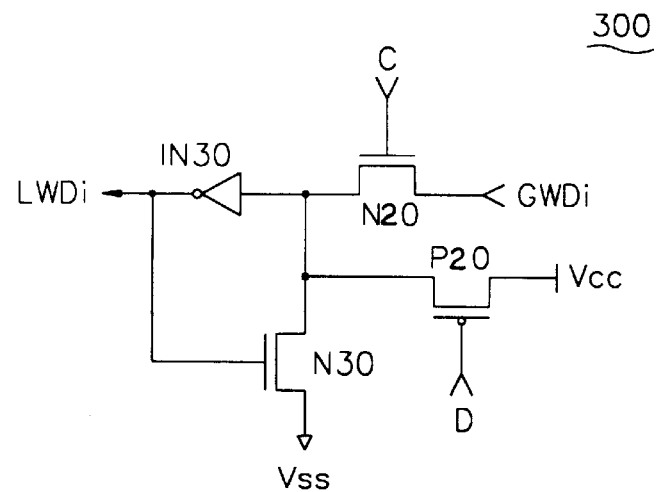
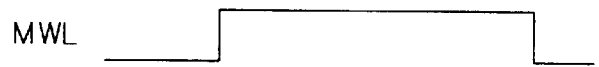
FIG. 10A  MWL
FIG. 10B  GWDi
FIG. 10C  C
FIG. 10D  D
FIG. 10E  LWDi
FIG. 10F  SWL

WORDLINE DRIVER FOR SEMICONDUCTOR MEMORY DEVICE

This application claims the benefit of Korean Application No. 98-13619 filed Apr. 16, 1998, which is hereby incorporated by reference.

BACKGROUND OF THE INVENTION

1. Field of the Invention

The present invention relates to a semiconductor memory device, and more particularly to a wordline driver for a semiconductor memory device. Although the present invention is suitable for a wide scope of applications, it is particularly suitable for reducing a driving voltage in the semiconductor memory device.

2. Discussion of the Related Art

When a row decoder decodes an externally applied row address in a semiconductor memory device, a wordline driver drives a wordline in accordance with a signal outputted from the row decoder. As a more integrated memory device is required, a design rule of the wordline becomes smaller. Also, the number of cells driven by a single wordline is increased with this trend.

To satisfy such demand, a dual wordline decoding scheme (DWDS) has been introduced. A wordline of the DWDS is divided by main wordlines and sub-wordlines and driven by hierarchically decoding a row address.

FIG. 1 is a block diagram of a dual wordline driver (DWD) in accordance with a background art. Specifically, the DWD includes a row decoder RD 10 decoding an externally inputted row address and outputting a main decoding signal. A plurality of wordline drive decoders WDD 20 each decoding two lowest bits among row address signals and outputting a sub-decoding signal. A plurality of sub-wordline drivers SWD 30 driving sub-wordlines using the main decoding signal from the row decoder RD 10 and the sub-decoding signals from the wordline drive decoders WDD 20.

The wordline drive decoders WDD 20 and the sub-wordline drivers SWD 30 are hierarchically connected each other. A plurality of cell arrays divided by a bitline sensing amplifier (BLSA) constitute a single bank.

FIG. 2 is a detailed diagram illustrating a part of the wordline driver for the semiconductor memory device.

FIG. 3 illustrates a circuit diagram of a single sub-wordline driver SWD 30. As shown therein, the sub-wordline driver SWD 30 includes a PMOS transistor P1 having a gate receiving an inverted main decoding signal MWLb and a source receiving a sub-decoding signal Wdi. An NMOS transistor N1 are connected between a drain of the PMOS transistor P1 and a ground Vss and having a gate receiving the inverted main decoding signal MWLb. A second NMOS transistor N2 are connected in parallel between the source and drain of the PMOS transistor P1 and having a gate receiving a main decoding signal MWL.

Each drain of the PMOS transistor P1 and the first NMOS transistor N1 and the source of the second NMOS transistor N2 are connected with a sub-wordline SWL through an output node A.

The operation of the wordline driver for the semiconductor memory device will be described as follows.

When a row address signal is externally inputted, as shown in FIG. 2, each pair of the wordline drive decoders WDD 20 respectively outputs four decoding signals WDi by decoding the two lowest bits among input row address signals. The row decoder RD 10 outputs the main decoding signals MWL and MWLb in accordance with a remaining row address signal.

Accordingly, the plurality of sub-wordline drivers SWD 30 enable each corresponding the sub-wordlines SWL in accordance with each level of the main decoding signals MWL, MWLb and the decoding signals WDi from the wordline drive decoder WDD 20.

Specifically, as shown in FIGS. 4A through 4D, only the first NMOS transistor N1 of the sub-wordline driver 30 is turned on for a period t1, thus a signal transmitted to the sub-wordline SWL through the output node A becomes a low level. For a period t2, the sub-wordline SWL is maintained in the low level. The second NMOS transistor N2 and the PMOS transistor P1 of each sub-wordline driver SWD 30 are turned on for a period t3. The decoding signals WDi of a low level from the wordline drive decoder WDD 20 are transmitted to the subwordline SWL. For a period t4, both the first and second NMOS transistors N1 and N2 and the PMOS transistor P1 of the sub-wordline driver SWD 30 are turned on. The decoding signals WDi of a high level outputted from the wordline driver decoder WDD 20 are thus transmitted to the subwordline SWL.

Accordingly, the sub-wordline drivers SWD 30 respectively enable the sub-wordline SWL only when both the main decoding signal from the row decoder RD 10 and the decoding signals WDi from the wordline drive decoders 20 are at the high level. Considering one cell block in the background art as described above, since the main decoding signal MWL, the main decoding bar signal MWLb and the decoding signals WDi are designated in the same bank, the above signals remain inactive while one wordline is active.

On the other hand, when the wordline driver according to the background art is applied to a multi-bank memory (i.e., a single wordline drive decoder driving sub-wordline drivers with several banks), the wordline driver cannot be operative under this condition. In the multi-bank memory, a wordline may be independently enabled by each bank. Since the decoding signals WDi of the wordline drive decoder commonly share several banks, both the decoding signals WDi and the decoding signal MWL should be enabled at the high level in order to enable a wordline of the bank.

However, when the main decoding bar signal MWLb and the decoding signals WDi are enabled to operate a wordline of a second bank before disabling the wordline of the first bank after predetermined time, the decoding signals WDi of the first wordline drive decoder is disabled. Consequently, the wordline designated to the decoding signals WDi of the first wordline drive decoder is disabled and the wordline designated to the decoding signals WDi of the second wordline drive decoder is enabled, thereby damaging cell data.

Accordingly, when the wordline driver according to the background art is applied to the multi-bank memory, an additional control line should be provided to eliminate a damage in the cell data. Increases in chip size and power consumption for driving the wordline are unavoidable.

SUMMARY OF THE INVENTION

Accordingly, the present invention is directed to a wordline driver for semiconductor memory device that substantially obviates one or more of problems due to limitations and disadvantages of the related art.

An object of the present invention is to provide a wordline driver for a memory device suitable for a multi-bank memory by hierarchically connecting local wordline drivers among wordline drive decoders and sub-wordline drivers.

Another object of the present invention is to provide a wordline driver for a memory for reducing chip size of a multi-bank memory and power consumption to drive a wordline.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a wordline driving device for a memory includes row decoders for generating main decoding signals in accordance with externally inputted row address signals, wordline drive decoders for outputting global decoding signals in accordance with the row address signals, local wordline decoders for receiving the global decoding signals from the wordline drive decoders and outputting local wordline decoding signals and sub-wordline drivers for enabling a sub-wordline by being selected by the local wordline decoding signals from the local wordline drivers and the main decoding signals from the row decoders, wherein the wordline drive decoders, the local wordline drivers and the sub-wordline drivers are hierarchically connected to each other.

In another aspect of the present invention, a wordline driver for a memory device includes a row decoder decoding externally inputted row address signals and outputting a main decoding signal and a main decoding bar signal, a wordline drive decoder decoding two lowest bits among the row address signals and outputting a global decoding signal, a local wordline driver receiving first and second signals and outputting a local wordline driving signal in accordance with the global decoding signal corresponding to the wordline drive decoder, and a sub-wordline driver coupled to the wordline drive decoder and the local wordline driver and outputting a sub-wordline driving signal to a sub-wordline in accordance with the local wordline decoding signal from the local wordline driver, and the main decoding signal and the main decoding bar signal outputted from the row decoder.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 7 is a detailed diagram of a local wordline driver 300 of FIG. 6;

FIGS. 8A through 8F are timing diagrams of the local wordline driver 300 of FIG. 7;

FIG. 9 is a detail block diagram of a local wordline driver 300 of FIG. 6 according to a second embodiment of the present invention; and FIG. 10 is timing diagrams of the local wordline driver 300 of FIG. 9.

DETAILED DESCRIPTION OF THE INVENTION

Reference will now be made in detail to the preferred embodiments of the present invention, examples of which are illustrated in the accompanying drawings.

Figure 1:
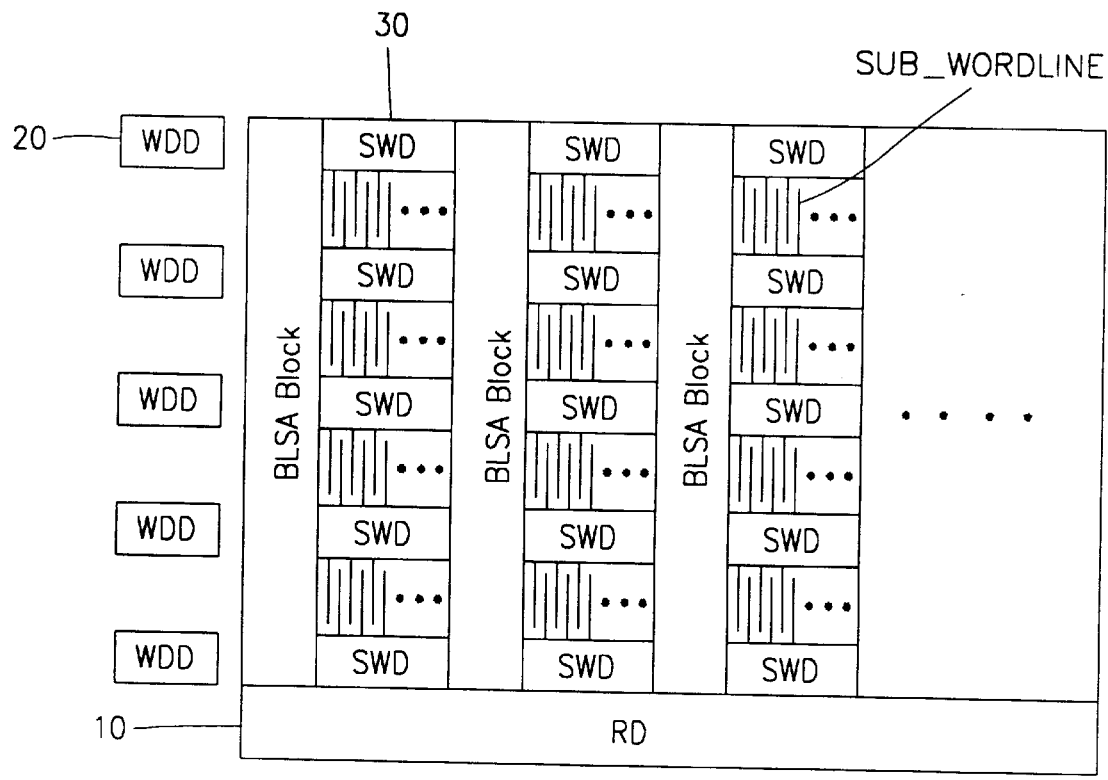
FIG. 1 is a block diagram of a wordline driver for a semiconductor memory device.
Figure 2:
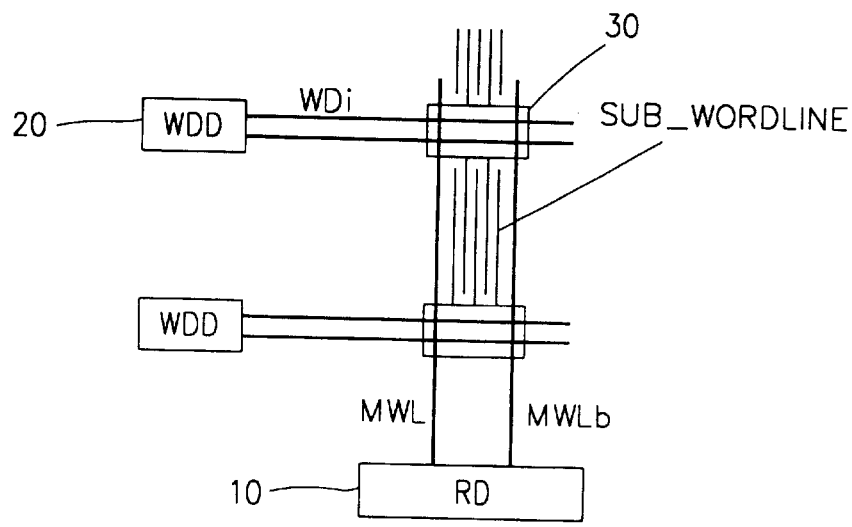
FIG. 2 is a detailed diagram illustrating a part of the wordline driver of FIG. 1.
Figure 3:
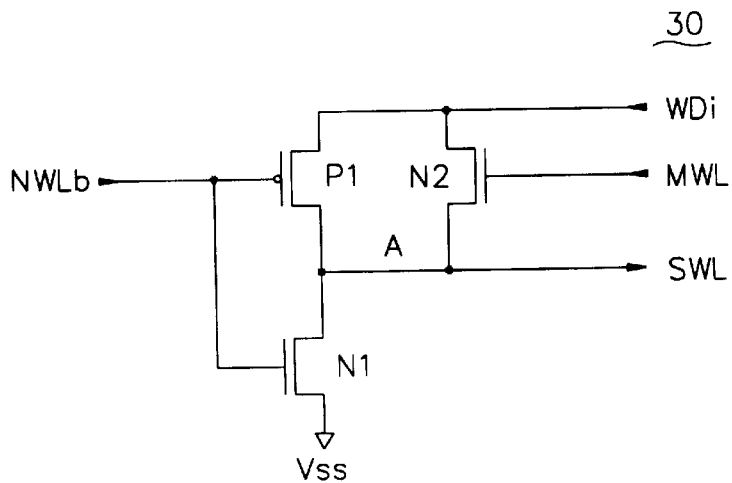
FIG. 3 is a circuit diagram of a sub-wordline driver of FIG. 2.
Figure 4A:
FIGS. 4A to 4D are timing diagrams of the sub-wordline driver of FIG. 3.
Figure 4B:
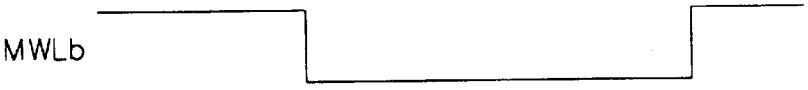
Figure 4C:
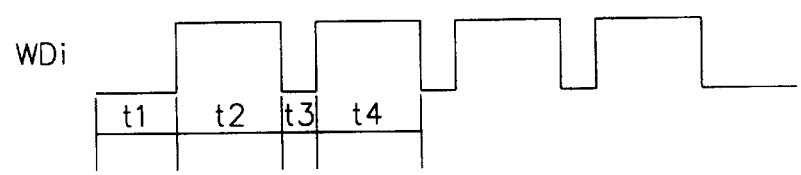
Figure 4D:
Figure 5:
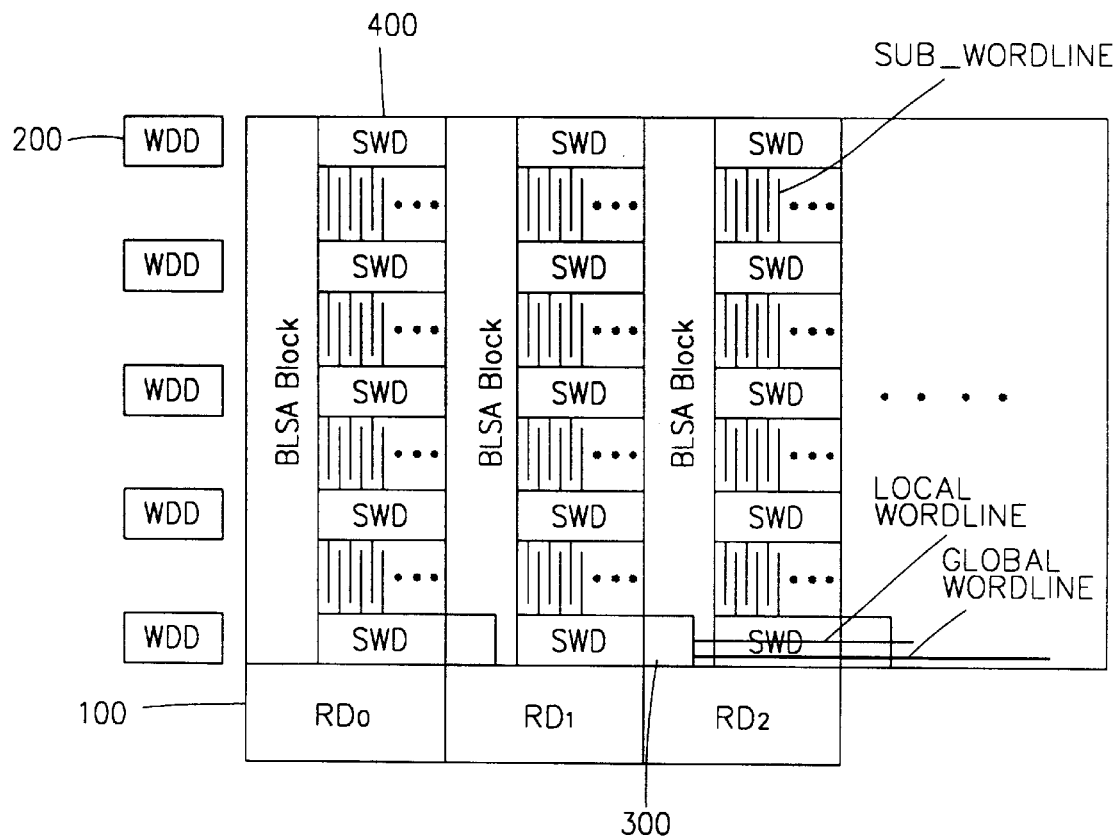
FIG. 5 is a block diagram of a wordline driver according to the present invention.

According to the present invention as shown in FIG. 5, wordlines are divided by main wordlines and sub-wordlines, and local wordline drivers in one bank are provided therebetween, thereby hierarchically decoding row address signals and driving the wordlines. In the present invention, decoding signals outputted from a wordline drive decoder WDD 200 commonly share sub-wordline drivers SWD 400 of several banks. Thus, the decoding signals from the wordline drive decoder WDD 200 are hierarchically formed, and divided into a global decoding signal GWDi and a local wordline driving signal LWDi.

Local wordline drivers LWD 300 managing each bank are additionally provided between the wordline drive decoders WDD 200 and the sub-wordline drivers SWD 400. The local wordline drivers LWD 300 respectively output local wordline driving signals LWDi, thereby driving the sub-wordline drivers SWD 400 and enabling the sub-wordlines.

Figure 6:
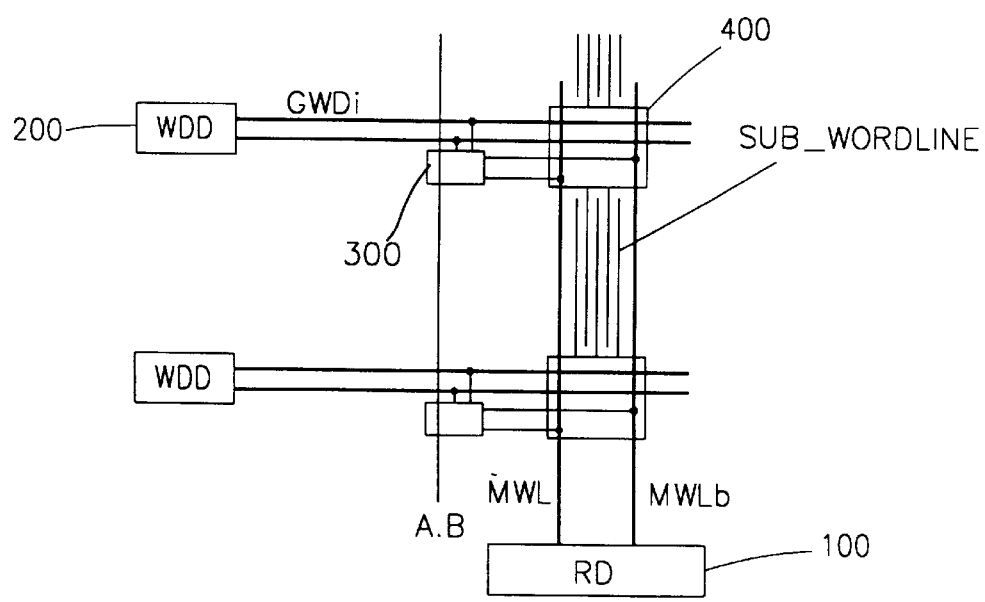
FIG. 6 is a detailed diagram illustrating a part of the wordline driver of FIG. 5.

FIG. 6 is a detailed diagram illustrating a part of the wordline driver of FIG. 5. As shown therein, the wordline driver includes row decoders RD 100 decoding externally inputted row address signals and respectively outputting a main decoding signal MWL and a main decoding bar signal MWLb. A pair of wordline drive decoders WDD 200 decode the two lowest bits among the row address signals and outputting global decoding signals GWDi. Local wordline drivers LWD 300 respectively outputting a local wordline driving signal LWDi in accordance with the global decoding signals GWDi from the wordline drive decoders WDD 200 and first and second signals A, B from an external control circuit (not shown). Each sub-wordline driver SWD 400 outputs a sub-wordline driving signal SWL in accordance with the main decoding signal MWL and the main decoding bar signal MWLb of the corresponding row decoder 100. The control circuit (not shown) may be internally provided in the row decoder in each bank or an external position.

According to a first embodiment of the present invention, as shown in FIG. 7, the local wordline driver LWD 300 includes an NMOS transistor N10 having a drain receiving the global wordline decoding signal GWDi and a gate receiving a first signal A. A PMOS transistor P10 having a drain connected with a source of the NMOS transistor N10 and a source and a gate receiving a power supply voltage Vcc and a second signal B, respectively. A first inverter IN10 having an input terminal connected with the source of the NMOS transistor N10 and inverting an output from the NMOS transistor N10 or the PMOS transistor P10, thereby outputting the local wordline driving signal LWDi. A second inverter IN20 inverting an output signal for the first inverter IN10 and supplying an output signal to the first inverter IN10.

The operation of the wordline driver according to the first embodiment of the present invention will be described with reference to the accompanying drawings.

In FIG. 5, when the selected row decoder RD0 100 of a bank0 to enable the sub-wordline driver SWD 400 outputs the main decoding signal MWL (as shown in FIG. 8A) in accordance with externally inputted row address signals. Also, the wordline drive decoder WDD 200 outputs the global wordline decoding signal GWDi (as shown in FIG. 8B) using the two lowest bits among the inputted row address signals. Thereafter, the row decoder RD 100 decodes according to the remaining bits except the two bits used by the wordline drive decoder WDD 200.

When the global wordline decoding signal GWDi from the wordline drive decoder WDD 200 is transited to the low level, the first signal A outputted from the external control circuit (not shown) is enabled as a pulse in FIG. 8C and applied to the gate of the NMOS transistor N10 of the local wordline driver LWD 300. Subsequently, the NMOS transistor N10 is turned on and outputs a signal at the low level in accordance with the global wordline decoding signal GWDi at the low level, which is applied to the source thereof.

The first inverter IN10 receiving the output signal from the NMOS transistor inverts the signal to the low level and thus outputs the local wordline driving signal LWDi at the high level to the sub-wordline driver SWD 400.

The global wordline decoding signal GWDi from the wordline drive decoder 200 is transited to the high level. Nonetheless, the local wordline driving signal LWDi at the high level outputted from the first inverter IN10 maintains the high level by a latch including the first inverter IN10 and the second inverter IN20, after the first signal A is transited to the low level. The gate of the first PMOS transistor P10 receives the second signal B at the high level supplied from the external control circuit.

Next, in accordance with the high-level local wordline driving signal LWDi from the local wordline driver LWD 300, the sub-wordline driver SWD 400 of FIG. 6 is driven and outputs a wordline driving signal SWL at the high level (as shown in FIG. 8F), thereby enabling a wordline corresponding to the wordline driving signal SWL.

Similarly, when the second signal B is externally applied to the gate of the PMOS transistor P10 at the low level, the PMOS transistor P10 is turned on. Thus, a power supply voltage Vcc at the high level is applied to an input terminal of the first inverter IN10, and the first inverter IN10 outputs the local wordline driving signal LWDi at the low level to the sub-wordline driver 400. Accordingly, the sub-wordline driver SWD 400 is disabled.

FIG. 9 illustrates a local wordline driver 300 of FIG. 5 according to a second embodiment of the present invention. As shown therein, the local wordline driver 300 includes a second NMOS transistor N20 having a drain for receiving a global wordline decoding signal GWDi and a gate for receiving a third signal C. A second PMOS transistor P20 having a drain connected to a drain of a third NMOS transistor N30, a source for receiving a power supply voltage Vcc and a gate for receiving a fourth signal D. A third inverter IN30 having an input terminal connected to the source of the second NMOS transistor N20, and inverting a signal outputted from the second NMOS transistor or from the second PMOS transistor P20, thereby outputting a local wordline driving signal LWDi. A third NMOS transistor N30 having a gate receiving the local wordline driving signal LWDi outputted from the third inverter IN30, a source connected with a ground Vss, and a drain connected with the input terminal of the third inverter IN30.

The operation of the wordline driving device having the local wordline driver according to the second embodiment of the present invention will be described with reference to the accompanying drawings.

The row decoder RD 100 selected to enable a sub-wordline driver in FIG. 6 outputs a main decoding signal MWL (as shown in FIG. 10A) in accordance with externally inputted row address signals. The wordline drive decoder WDD 200 outputs a global wordline decoding signal GWDi (as shown in FIG. 10B) to the local wordline driver LWD 300 using the two lowest bits among the row address signals.

The third signal C (as shown in FIG. 10C) outputted from an external control circuit (not shown) is applied to the gate of the second NMOS transistor N20 of the local wordline driver LWD 300. Thereafter, the fourth signal D is applied to the gate of the second PMOS transistor P20.

Accordingly, the second NMOS transistor N20 is turned on and outputs the low signal to the inverter 30, and the second PMOS transistor P20 is turned off. The third inverter IN30 outputs the local wordline driving signal LWDi at the high level to the sub-wordline driver SWD 400.

Although the global wordline decoding signal GWDi from the wordline drive decoder WDD 200 is transited to the high signal after the third signal C is transited to the low signal. The fourth signal D is maintained to have the high level and the second PMOS transistor P20 is kept off. The local wordline driving signal LWDi at the high level outputted from the third inverter IN30 maintains the high signal by a latch including the third inverter IN30 and the third NMOS transistor N30.

When the fourth signal D outputted from the external control circuit (not shown) is transited to the low level and applied to the gate of the second PMOS transistor P20, the second PMOS transistor P20 is turned on. Thus, the power supply voltage Vcc at the high level is applied to the input terminal of the third inverter IN30, which outputs the local wordline driving signal LWDi at the low level to the sub-wordline driver SWD 400. Accordingly, the sub-wordline driver SWD 400 is disabled.

In the first and the second embodiments of the present invention, the wordline drive decoder WDD 200 outputs the global decoding signal GWDi, and the local wordline driver LWD 300 outputs the local wordline driving signal LDWi in accordance with the global decoding signal GWDi, thereby managing a single bank.

Although the global decoding signal GWDi from the wordline drive decoder WDD 200 is disabled to enable a wordline of another bank for using in the multi-bank memory, the wordline driver according to the present invention controls the local wordline driver LWD 300 using the first and the second signals (A, B or C, D) from the control circuit of the corresponding bank. Thus, it can statically enables the local wordline driver LWD 300 for a predetermined time.

As described above, the decoding signals outputted from the wordline drive decoder are hierarchically formed, divided into the global decoding signals GWDi and the local wordline decoding signals LWDi. Therefore, the wordline driver according to the present invention is suitable for the multi-bank memory and reduces a chip size and a power consumption to drive the wordlines.

It will be apparent to those skilled in the art that various modifications and variations can be made in the wordline driving device for a memory of the present invention without departing from the spirit or scope of the invention. Thus, it is intended that the present invention covers the modifications and variations of this invention provided they come within the scope of the appended claims and their equivalents.

What is claimed is:

1. A wordline driver for a memory device, comprising:

a row decoder decoding externally inputted row address signals and outputting a main decoding signal and a main decoding bar signal;

a wordline drive decoder decoding two lowest bits among the row address signals and outputting a pair of global decoding signals;

a local wordline driver receiving first and second signals and the global decoding signals from the wordline drive decoder and outputting a local wordline driving signal; and a sub-wordline driver coupled to the wordline drive decoder and the local wordline driver and outputting a sub-wordline driving signal to a sub-wordline in accordance with the local wordline decoding signal from the local wordline driver, and the main decoding signal and the main decoding bar signal outputted from the row decoder.

2. The wordline driver according to claim 1, wherein the local wordline driver includes a latch statically enabling for a desired period regardless of the global decoding signal.

3. The wordline driver according to claim 1, wherein the local wordline driver comprises:

a first NMOS transistor having a drain receiving the global wordline decoding signal and a gate receiving the externally inputted first signal;

a first PMOS transistor having a drain connected to a source of the first NMOS transistor, a source receiving a power supply voltage, and a gate receiving the second signal;

a first inverter having an input terminal connected to the source of the first NMOS transistor and inverting an output signal from the first NMOS transistor or the first PMOS transistor, thereby outputting the local wordline driving signal to the sub-wordline driver; and a second inverter inverting an output signal from the first inverter and outputting an inverted signal to the input terminal of the first inverter.

4. The wordline driver according to claim 1, wherein the local wordline driver comprises:

a first NMOS transistor having a drain receiving the global wordline decoding an output signal from the wordline drive decoder and a gate receiving the first signal;

a first PMOS transistor having a drain connected to a source of the first NMOS transistor, a source receiving a power supply voltage, and a gate receiving the fourth signal;

a first inverter having an input terminal connected to the source of the first NMOS transistor and inverting an output signal from the first NMOS transistor or the first PMOS transistor, thereby outputting the local wordline driving signal to the sub-wordline driver; and a second NMOS transistor having a gate receiving the local wordline driving signal from the first inverter and a drain connected to the input terminal of the first inverter.

5. The wordline driver according to claim 1, wherein the first and second signals are outputted from an external control circuit.

6. The wordline driver according to claim 1, wherein the row decoder decodes using bits except the two bits used by the wordline drive decoder.

7. The wordline driver according to claim 1, wherein the first signal is enabled as a pulse signal when the global wordline decoding signal is transited to a low level signal.

8. The wordline driver according to claim 3, wherein the first NMOS transistor is turned on and outputs a low level signal in accordance with the global wordline decoding signal having a low level.

9. The wordline driver according to claim 3, wherein the first PMOS is turned on when the second signal is applied to the first PMOS, so that the subwordline is disabled.

10. The wordline driver according to claim 4, wherein the first PMOS is turned on when the second signal is applied to the first PMOS, so that the subwordline is disabled.

* * * * *